United States Patent
Noguchi (10) Patent No.: US 9,876,078 B2
(45) Date of Patent: Jan. 23, 2018

(54) METHOD FOR SLICING SEMICONDUCTOR SINGLE CRYSTAL INGOT

(71) Applicant: SUMCO TECHXIV CORPORATION, Nagasaki (JP)

(72) Inventor: Hiroshi Noguchi, Miyazaki (JP)

(73) Assignee: SUMCO TECHXIV CORPORATION, Nagasaki (JP)

(*) Notice: Subject to any disclaimer, the term of this patent is extended or adjusted under 35 U.S.C. 154(b) by 630 days.

(21) Appl. No.: 14/212,370

(22) Filed: Mar. 14, 2014

(65) Prior Publication Data
US 2014/0295126 A1 Oct. 2, 2014

(30) Foreign Application Priority Data

Mar. 29, 2013 (JP) ................................. 2013-071236

(51) Int. Cl.
*B28D 1/08* (2006.01)
*B23D 61/18* (2006.01)
(Continued)

(52) U.S. Cl.
CPC ...... *H01L 29/0657* (2013.01); *B23D 57/0023* (2013.01); *B23D 57/0046* (2013.01);
(Continued)

(58) Field of Classification Search
CPC ........ B28D 1/08; B28D 5/0088; B28D 5/042; B28D 5/045; B23D 57/0007;
(Continued)

(56) References Cited

U.S. PATENT DOCUMENTS 5,313,741 A * 5/1994 Toyama ............... B23D 59/001
125/13.02
5,778,869 A * 7/1998 Toyama ............. B23D 57/0053
125/16.02
(Continued)

FOREIGN PATENT DOCUMENTS

| JP | 1-15363 | 3/1989 |
| JP | 10-182299 | 7/1998 |
| JP | 2005-231248 | 9/2005 |

OTHER PUBLICATIONS

Taiwanese Office Action dated Mar. 9, 2016 for Taiwanese App. No. 102143991.

*Primary Examiner* — Eileen Morgan
(74) *Attorney, Agent, or Firm* — Greenblum & Bernstein, P.L.C.

(57) ABSTRACT

An amount of warp of a wafer is not only reduced, but the amount of warp of the wafer is also accurately controlled to a desired amount. The present invention relates to a method for slicing a semiconductor single crystal ingot, by which a cylindrical semiconductor single crystal ingot is bonded to and held by a holder in a state where the ingot is rotated at a predetermined rotation angle around a crystal axis of the ingot different from a center axis of a cylinder of this ingot and the ingot is sliced by a cutting apparatus in this state. The predetermined rotation angle at the time of bonding and holding the ingot with the use of the holder in such a manner that an amount of warp of a wafer sliced out by the cutting apparatus becomes a predetermined amount.

5 Claims, 12 Drawing Sheets

(51) Int. Cl.
  *H01L 29/06* (2006.01)
  *B28D 5/04* (2006.01)
  *B23D 57/00* (2006.01)
  *B28D 5/00* (2006.01)
(52) U.S. Cl.
  CPC ............... *B23D 61/18* (2013.01); *B28D 1/08* (2013.01); *B28D 5/0088* (2013.01); *B28D 5/042* (2013.01); *B28D 5/045* (2013.01); *Y10T 428/21* (2015.01)
(58) Field of Classification Search
  CPC .............. B23D 57/0023; B23D 57/003; B23D 57/0046; B23D 61/18; B23D 61/185
  USPC .............................. 451/41; 125/16.01, 16.02
  See application file for complete search history.

(56) References Cited

U.S. PATENT DOCUMENTS

| | | | | |
|---|---|---|---|---|
| 5,875,769 A * | 3/1999 | Toyama | ................ | B28D 5/045 125/16.01 |
| 5,893,308 A * | 4/1999 | Katamachi | ........... | B23Q 16/001 125/21 |
| 5,904,136 A * | 5/1999 | Nagatsuka | ........... | B28D 5/0088 125/16.02 |
| 6,065,461 A * | 5/2000 | Asakawa | ............... | B28D 5/007 125/16.02 |
| 6,135,102 A * | 10/2000 | Sorimachi | ............ | B28D 5/0082 125/16.02 |
| 6,145,422 A * | 11/2000 | Katamachi | ........... | B23Q 16/001 125/21 |
| 6,283,111 B1 * | 9/2001 | Onizaki | ............. | B23D 57/0046 125/16.01 |
| 6,352,071 B1 * | 3/2002 | Kononchuk | ....... | B23D 57/0053 125/16.02 |
| 8,146,581 B2 * | 4/2012 | Kitagawa | ............ | B24B 27/0633 125/12 |
| 8,567,384 B2 * | 10/2013 | Oishi | ................... | B28D 5/0064 125/16.01 |
| 2004/0084042 A1 * | 5/2004 | McAulay | ............ | B23D 61/185 125/21 |
| 2009/0288530 A1 * | 11/2009 | Oishi | ................. | B24B 27/0633 83/22 |
| 2010/0037881 A1 * | 2/2010 | Oishi | ................... | B28D 5/0064 125/21 |
| 2010/0089377 A1 * | 4/2010 | Oishi | ................... | B28D 5/0064 125/16.02 |
| 2012/0304839 A1 | 12/2012 | Okita | | |
| 2013/0144420 A1 * | 6/2013 | Zavattari | ............. | B28D 5/0064 700/108 |
| 2013/0144421 A1 * | 6/2013 | Zavattari | ............. | B28D 5/0064 700/108 |
| 2013/0174828 A1 * | 7/2013 | Zavattari | ............. | B28D 5/0064 125/21 |
| 2014/0083407 A1 * | 3/2014 | Schmid | ................. | B28D 5/045 125/21 |

* cited by examiner

METHOD FOR SLICING SEMICONDUCTOR SINGLE CRYSTAL INGOT

TECHNICAL FIELD

The present invention relates to a method for slicing a semiconductor single crystal ingot such as a silicon single crystal ingot and fabricating a semiconductor single crystal wafer such as a silicon single crystal wafer. It is to be noted that the present application claims the priority based on Japanese Patent Application No. 71236 (Japanese Patent Application No. 2013-71236) filed on Mar. 29, 2013, and all contents of Japanese Patent Application No. 2013-71236 are invoked for the present application.

BACKGROUND ART

There has been disclosed a single-crystal cutting method for cutting a single-crystal member having a cleavage plane along a planned cutting plane by allowing a machining tool that cuts the single-crystal member to cut into a single-crystal member while relatively moving the single-crystal member and the machining tool, providing a cutting direction of the machining tool in a direction inclined toward a direction along which chips of the single-crystal member are discharged by a cutting tool with respect to a normal direction vertical to an intersection line of the planned cutting plane and the cleavage plane, and providing an inclination angle of the cutting direction from the normal line as an angle at which cutting efficiency of the single-crystal member provided by the machining tool becomes maximal (see, e.g., Patent Document 1). According to this single-crystal cutting method, the cleavage plane of the single-crystal member appears as intersection lines A and B on the cutting planned plane. Further, the cutting direction along which the cutting efficiency becomes maximal is each of $Z_1$, $Z_2$, $Z_3$, $Z_4$, $Z_5$, $Z_6$, $Z_7$, and $Z_8$ directions inclined at rotation angles $\theta_1$, $\theta_2$, $\theta_3$, $\theta_4$, $\theta_5$, $\theta_6$, $\theta_7$, and $\theta_8$ toward a clockwise or counterclockwise chip discharge direction from normal lines P and Q vertical to respective intersection lines A and B. Furthermore, when the single-crystal member is made of lithium tantalite, $\theta_1$ is 24 degrees, $\theta_2$ is seven degrees, $\theta_3$ is 16 degrees, $\theta_4$ is 8 degrees, $\theta_5$ is 20 degrees, $\theta_6$ is 17 degrees, $\theta_7$ is 16 degrees, and $\theta_8$ is 5 degrees.

According to the thus configured single-crystal cutting method, the direction along which chips of the single-crystal member are discharge is determined as a positive rotation angle with respect to each normal line that is present on the planned cutting plane of the single crystal and vertical to each intersection line of this planned cutting plane and the cleavage plane, cutting is effected from the direction along which the cutting efficiency becomes maximal that is determined by crystallographic characteristics of the single-crystal member having this positive rotation angle and pressure contact force between this single-crystal member and the machining tool, the single-crystal member is then cut, and hence cutting elimination efficiency is greatly improved, thus shortening a long cutting machining time. Moreover, since excessive distortion is not applied to the single-crystal member during machining, a cut wafer does not bend or warp.

On the other hand, there is disclosed a single-crystal cutting method for slicing a single-crystal ingot along a planned cutting plane by allowing a cutter to cut into the single-crystal ingot while relatively moving the single-crystal ingot and the cutter, setting a crystal orientation of the single-crystal ingot to <111>, and effecting slicing in parallel with a direction of a crystal habit line (see, e.g., Patent Document 2).

According to the thus configured single-crystal cutting method, since <111> is determined as the crystal orientation of the single-crystal ingot in advance and the single-crystal ingot is sliced in parallel with a direction of the crystal habit line by the cutter in a state that a cutting direction of the cutter is set to the direction of the crystal habit line of the single-crystal ingot, a wafer that very hardly bends or warps can be cut and separated, and cutting machining efficiency can be considerably improved. That is, a cleavage plane of a macro single crystal ingot is usually a (111) plane, the slice direction of the single crystal ingot is corrected along the crystal habit line that is produced due to a difference in development level between crystal planes, and hence an ideal wafer that very hardly bends or warps can be obtained from the cut wafer.

PRIOR ART REFERENCES

Patent Document

Patent Document 1: Japanese Examined Patent Application Publication No. Hei 1-15363 (claim 1, lines 31-32 in the third column of the specification, line 42 in the third column to line 6 in the fourth column in the specification, line 39 in the sixth column to line 8 in the seventh column in the specification, FIG. 1 to FIG. 3)

Patent Document 2: Japanese Unexamined Patent Application Publication No. 2005-231248 (claim 1, paragraphs [0007] and [0016])

SUMMARY OF THE INVENTION

Problems to be Solved by the Invention

However, according to the single-crystal cutting method disclosed in conventional Patent Document 1, an angle formed between the planned cutting plane and the cleavage plane of the single-crystal member is not defined at all, and there is an inconvenience that how an amount of warp of the wafer after cutting the single-crystal member varies is unknown. Further, according to the single-crystal cutting method disclosed in conventional Patent Document 1, a deviation of a cutting position of the single-crystal member from the cleavage plane, i.e., the intersection lines A and B that appear on the planned cutting plane is just 5 to 25 degrees, and there is a problem that the amount of warp of the wafer cannot be sufficiently improved if such a small angle is provided. Furthermore, according to the conventional single-crystal cutting method disclosed in Patent Document 1, since excessive distortion is not applied to the single-crystal member during the cutting processing of the single-crystal member, the cut wafer does not bend or warp, but there is also a problem that how the amount of warp of the wafer is controlled is unknown. On the other hand, according to the conventional single-crystal cutting method disclosed in Patent Document 2, when the single-crystal ingot is sliced along its crystal habit line, the wafer can hardly bend or warp, but there is a problem that the amount of warp of the wafer cannot be controlled.

It is an object of the present invention to provide a method for slicing a semiconductor single crystal ingot, the method enabling not only reducing an amount of warp of a wafer but also accurately controlling the amount of warp of the wafer to a desired amount.

Means for Solving the Problems

According to a first aspect of the present invention, there is provided a method for slicing a semiconductor single crystal ingot, by which a cylindrical semiconductor single crystal ingot is bonded to and held by a holder in a state that the ingot is rotated at a predetermined rotation angle around a crystal axis of the ingot different from a center axis of the cylinder of the ingot, and the ingot is sliced by a cutting apparatus in this state, wherein the predetermined rotation angle at the time of bonding and holding the ingot with the use of the holder is determined in such a manner that an amount of warp of a wafer sliced out by the cutting apparatus becomes a predetermined amount.

According to a second aspect of the present invention, the invention based on the first aspect is characterized in that a correlation of a change in the amount of warp of the wafer relative to a change in the predetermined rotation angle is obtained by an experiment in advance, and the predetermined rotation angle is determined from the correlation.

According to a third aspect of the present invention, the invention based on the first aspect is characterized in that the predetermined rotation angle at the time of bonding and holding the ingot with the use of the holder is determined in such a manner that an amount of warp of a wafer sliced out by the cutting apparatus becomes minimum.

According to a fourth aspect of the present invention, the invention based on the first aspect is characterized in that the predetermined rotation angle at the time of bonding and holding the ingot with the use of the holder is determined in such a manner that an amount of warp of a wafer sliced out by the cutting apparatus becomes a predetermined amount and an amount of warp of the wafer after forming an epitaxial layer on a surface of the wafer becomes minimum.

According to a fifth aspect of the present invention, the invention based on the first aspect is characterized in that, when a rotation reference portion is formed on the ingot and a perpendicular drawn from the crystal axis of the ingot to the rotation reference portion is determined as a reference line, the predetermined rotation angle relative to this reference line falls within the range of 35 to 75 degrees, 105 to 145 degrees, 215 to 255 degrees, or 285 to 325 degrees.

According to a sixth aspect of the present invention, there is provided a semiconductor single crystal wafer obtained by bonding and holding a cylindrical semiconductor single crystal ingot with the use of a holder in a state that the ingot is rotated at a predetermined rotation angle around a crystal axis of the ingot different from a center axis of the cylinder of the ingot and slicing the ingot by a cutting apparatus in this state, wherein a rotation reference portion is formed on the ingot, and when a perpendicular drawn from the crystal axis of the ingot to the rotation reference portion is determined as a reference line, the predetermined rotation angle relative to the reference line falls within the range of 35 to 75 degrees, 105 to 145 degrees, 215 to 255 degrees, or 285 to 325 degrees.

Effects of the Invention

In the slicing method according to the first aspect of the present invention, before bonding and holding the cylindrical semiconductor single crystal ingot by using the holder of the cutting apparatus, the ingot is first provided to be rotatable around the crystal axis of the ingot different from the center axis of the cylinder thereof, and this ingot is then bonded to and held by the holder in a state that the ingot is rotated around the crystal axis at the predetermined rotation angle. At this time, since the predetermined rotation angle around the crystal axis is determined in such a manner that the amount of warp of the wafer sliced out by the cutting apparatus can be the predetermined amount, the amount of warp of the wafer after slicing the ingot can be accurately controlled to a desired amount.

In the slicing method according to the second aspect of the present invention, since a correlation about a change in an amount of warp of the wafer relative to a change in a predetermined rotation angle is obtained by an experiment in advance and the predetermined rotation angle is determined based on this correlation, the amount of warp of the wafer after slicing the ingot can be accurately controlled based on the desired amount.

In the slicing method according to the third aspect of the present invention, since the predetermined rotation angle around the crystal axis of the ingot is determined in such a manner that the amount of warp of the wafer sliced out by the cutting apparatus can become minimum, the amount of warp of the wafer after slicing the ingot can be reduced.

In the slicing method according to the fourth aspect of the present invention, since the predetermined rotation angle around the crystal axis of the ingot is determined in such a manner that the amount of warp of the wafer sliced out by the cutting apparatus becomes the predetermined amount and the amount of warp of the wafer after forming the epitaxial layer on the surface of this wafer becomes minimum, the amount of warp of the wafer after slicing the ingot and forming the epitaxial layer on the surface of the wafer can be reduced.

In the slicing method according to the fifth aspect of the present invention, the perpendicular drawn from the crystal axis of the ingot to the rotation reference portion is determined as the reference line, the predetermined rotation angle relative to this reference line is set to fall within the range of 35 to 75 degrees, 105 to 145 degrees, 215 to 255 degrees, or 285 to 325 degrees, and hence the amount of warp of the wafer after cutting the ingot becomes substantially the desired amount.

In the semiconductor single crystal wafer according to the sixth aspect of the present invention, the perpendicular drawn from the crystal axis of the ingot to the rotation reference portion is determined as the reference line, and the amount of warp of the wafer obtained by slicing the ingot having the predetermined rotation angle relative to the reference line being set to fall within the range of 35 to 75 degrees, 105 to 145 degrees, 215 to 255 degrees, or 285 to 325 degrees becomes substantially the desired amount.

BRIEF DESCRIPTION OF THE DRAWINGS

FIG. 3(a) is a perspective view of a wafer showing a mechanism that a cleavage plane appears in a cutting direction during cutting the ingot by the wire and the wire deviates in a direction of this cleavage plane, and 3(b) is aside elevation of the wafer after the cutting that produced large warp;

FIG. 5(a) is a front view of the ingot showing that the cleavage plane of the ingot is parallel to each wire mark on a surface of the ingot, 5(b) is a longitudinal sectional view of the ingot showing a state that the cleavage plane of the ingot is inclined relative to the crystal axis of the ingot, and 5(c) is a longitudinal sectional view of the ingot showing that the wire deviates in the direction of the cleavage plane;

FIG. 6(a) is a front view of the ingot showing that the cleavage plane of the ingot is parallel to each wire mark on the surface of the ingot, 6(b) is a longitudinal sectional view of the ingot showing a state that the cleavage plane of the ingot is parallel to the crystal axis of the ingot, and 6(c) is a longitudinal sectional view of the ingot showing that the wire moves straight along the cutting direction;

FIG. 7(a) is a block diagram showing a state that the crystal axis coincides with a center axis of a cylinder of the ingot and wires are arranged to extend in a direction perpendicular to the center axis of the cylinder and the crystal axis, 7(b) is a block diagram of the ingot showing a state that the center axis of the cylinder of the ingot does not coincide with the crystal axis, and 7(c) is a block diagram showing a state that the wires are arranged to extend in the direction perpendicular to the crystal axis that does not coincide with the center axis of the cylinder of the ingot;

MODES FOR CARRYING OUT THE INVENTION

Figure 1:
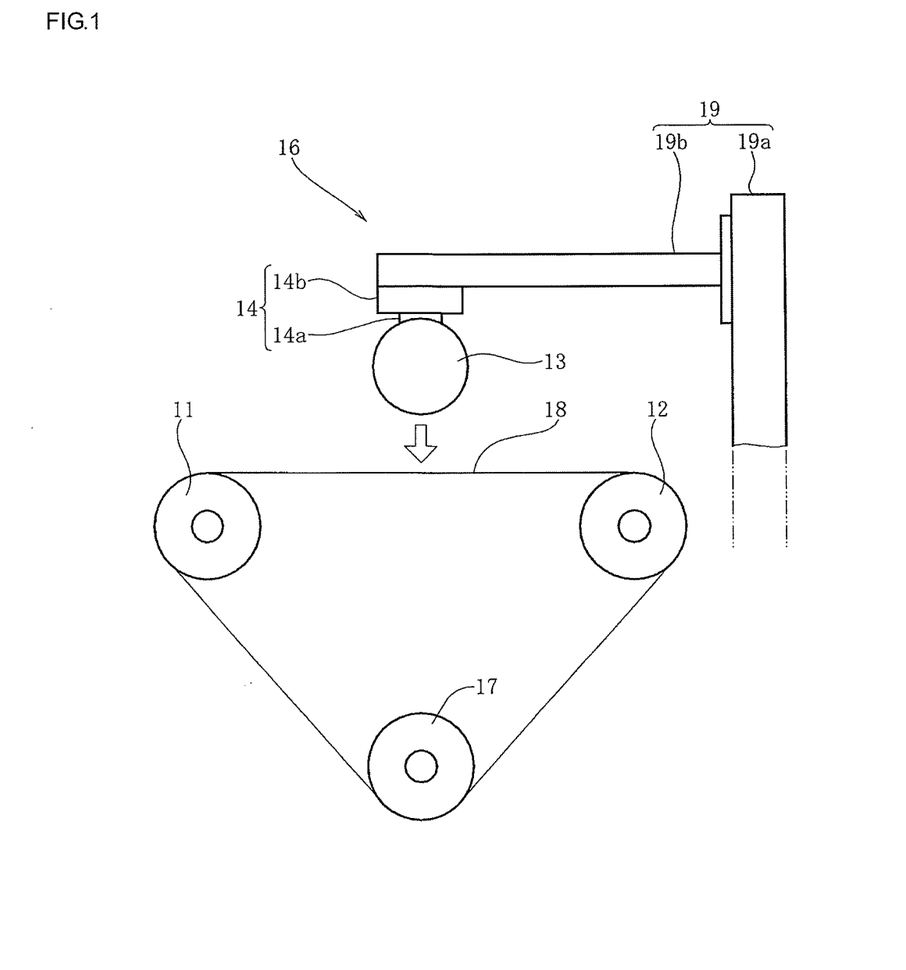
FIG. 1 is a front view of a primary part showing a state that a silicon single crystal ingot is to be sliced by a wire of a wire saw apparatus based on a slicing method according to a first embodiment of the present invention.
Figure 2:
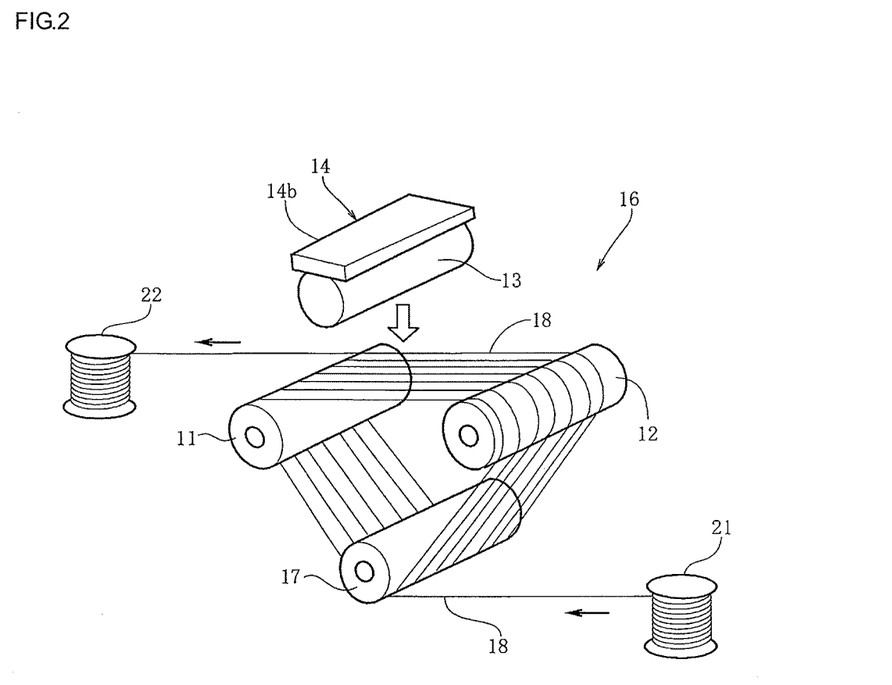
FIG. 2 is a perspective view of a primary part showing a state that the ingot is to be sliced by the wire of the wire saw apparatus.

Modes for carrying out the present invention will now be described with reference to the drawings. As shown in FIG. 1 and FIG. 2, a wire saw apparatus is used in order to slice and cut a silicon single crystal ingot 13. This wire saw apparatus 16 includes first and second main rollers 11 and 12 that have center axes parallel to each other and are arranged within the same horizontal plane, a single sub-roller 17 that is provided at an intermediate position of the first and second main rollers 11 and 12 below the first and second main rollers 11 and 12, a wire 18 that is wound and stretched around the first and second main rollers 11 and 12 and the single sub-roller 17, and a lifting apparatus 19 that moves up and down a holder 14 (FIG. 1 and FIG. 2). Further, a plurality of ring grooves (not shown) extending in a circumferential direction are formed on outer peripheral surfaces of the first and second main rollers 11 and 12 and the single sub-roller 17 at predetermined intervals in axial directions of the respective rollers 11, 12, and 17, i.e., for a thickness of a wafer to be sliced out at intervals in the axial directions of the respective rollers 11, 12, and 17. The wire 18 is one elongated wire wound around a supply bobbin 21 (FIG. 2), the wire 18 unreeled from this supply bobbin 21 is helically wound and stretched around the first and second main rollers 11 and 12 and the single sub-roller 17 in a substantially inverted triangle shape so that the wire 18 can be sequentially accommodated from each ring groove on one end side of these rollers into each ring groove on the other end side of the same, and the wire 18 is taken up by a take-up bobbin 22 (FIG. 2).

A holder 14 has a slice base 14a bonded to the ingot 13 and a work plate 14b that holds this slice base 14a. Although the slice base 14a is made of the same material as the ingot 13 or it is made of, e.g., glass, ceramics, carbon, or a resin, carbon, a resin, or the like is often used while considering a cost or easiness of molding. Further, an epoxy resin, a thermoplastic wax, or the like is used as an adhesive, and the work plate 14b is mainly made of SUS. Furthermore, the lifting apparatus 19 has a support member 19a that is provided to extend in a vertical direction and a horizontal member 19b that is disposed to this support member 19a to be upwardly or downwardly movable and holds the holder 14 on a lower surface at a distal end thereof. As a result, the ingot 13 adhering to the holder 14 can be moved up and down by the lifting apparatus 19.

Figure 7:
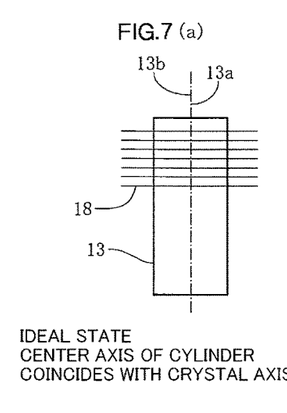

A description will now be given as to a method for slicing the silicon single crystal ingot 13 using the thus configured wire saw apparatus 16. The wire 18 is first wound and stretched between the first and second main rollers 11 and 12 and the single sub-roller 17. As a result, of the wire 18, the wire 18 horizontally stretched between the first and second main rollers 11 and 12 moves in the horizontal direction by rotation of the first and second main rollers 11 and 12 and the single sub-roller 17. Then, the ingot 13 is bonded to the slice base 14a disposed to the lower surface at the distal end of the horizontal member 19b of the lifting apparatus 19 through the work plate 14b. Here, a method for bonding the ingot 13 to the slice base 14b will now be described in detail. In the cylindrical ingot, an ideal state that the center axis of the cylinder coincides with the crystal axis (FIG. 7(a)) is rarely realized, and an actual state that the center axis of the cylinder does not coincide with the crystal axis (FIG. 7(b)) is realized in most cases. Therefore, the ingot 13 is first provided to be rotatable around the crystal axis 13b of the ingot 13 different from the center axis 13a of the cylinder (FIG. 7(c)). It is to be noted that the crystal axis 13b of the ingot 13 can be detected based on an angle of an X ray that is emitted and reflected on a crystal plane. Subsequently, the ingot 13 is bonded to the slice base 14b in a state that the ingot 13 is rotated at a predetermined rotation angle around the crystal axis 13b.

At this time, the predetermined rotation angle around the crystal axis 13b is determined in such a manner that an amount of warp of a wafer 23 obtained by slicing using the wire saw apparatus 16 can be a predetermined amount. As to this determination, it is preferable to obtain a correlation of a change in the amount of warp of the wafer 23 relative to a change in the predetermined rotation angle by an experiment in advance and determine the predetermined rotation angle based on this correlation. Moreover, it is preferable to determine a perpendicular drawn from the crystal axis 13b of the ingot 13 to an orientation flat 13c as a reference line 13d and set a predetermined rotation angle θ (FIG. 3 and FIG. 4) relative to this reference line 13d to fall within the range of 35 to 75 degrees, 105 to 145 degrees, 215 to 255 degrees, or 285 to 325 degrees. However, to bond the ingot 13 to the slice base 14a while avoiding the orientation flat 13c, it is preferable to set the predetermined rotation angle θ relative to the reference line 13d to fall within the range 35 to 75 degrees or 285 to 325 degrees, and more preferable to set the same to fall within the range of 40 to 60 degrees or 300 to 320 degrees. Here, the predetermined rotation angle θ relative to the reference line 13d is restricted to each of the above-described ranges because the wire 18 is apt to deviate in a direction of a cleavage plane 13e of the ingot 13 an amount of warp of the wafer 23 obtained by slicing this ingot 13 greatly fluctuates.

Then, the ingot 13 is moved in such a manner that the crystal axis 13b of the ingot 13 becomes substantially parallel to respective center axes of the first and second main rollers 11 and 12 above the wire 18 horizontally stretched between the first and second main rollers 11 and 12 and between vertical lines running through the respective center axes of the first and second main rollers 11 and 12 (FIG. 1 and FIG. 2). At this time, a vertical plane including the crystal axis 13b of the ingot 13 is arranged to be orthogonal to an extending direction of the wire 18 between the first and second main rollers 11 and 12 (FIG. 7(c)). In other words, the crystal axis of the ingot is arranged to be orthogonal to the plane formed of the wire 18 between the first and second main rollers 11 and 12 and the ingot cutting direction of the wire 18. Additionally, in this state, the ingot 13 is moved down in the vertical direction in this state and moved to a position cutting across a wire 18 that moves in the horizontal direction, thereby slicing the ingot 13. As a result, the amount of warp of the wafer 23 after slicing the ingot 13 can be accurately controlled to a desired amount.

Figure 3:
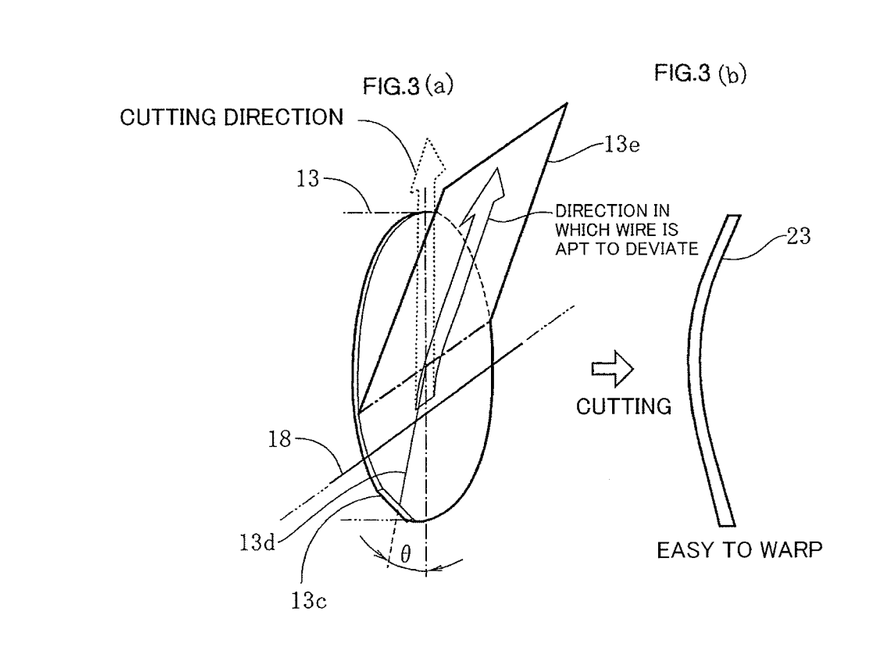
Figure 4A:
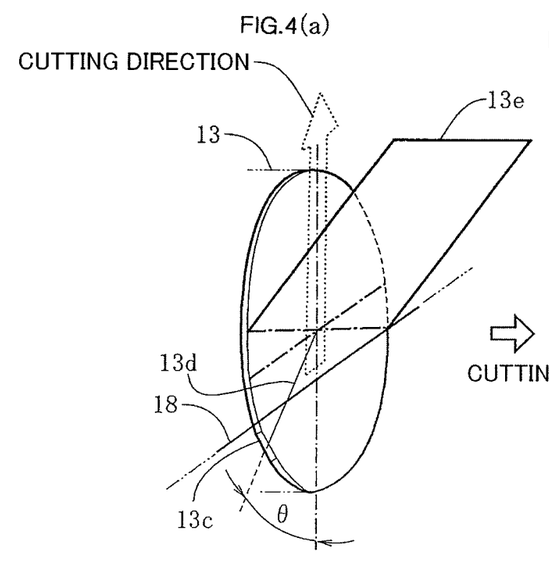
FIG. 4(a) is a perspective view of the wafer showing a mechanism that the cleavage plane does not appear in the cutting direction during cutting the ingot by the wire and the wire moves straight along the cutting direction, and 4(b) is a side elevation of the wafer after the cutting without warp.
Figure 4B:
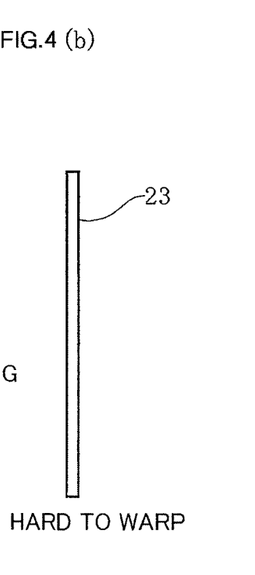
Figures 5A, 5B, 5C:
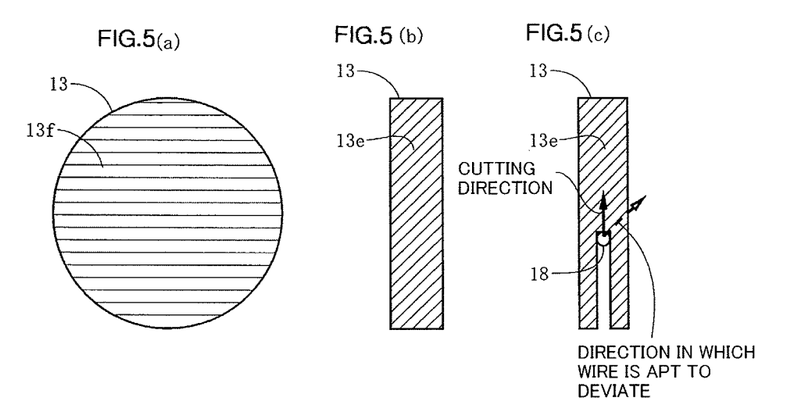
Figure 6:
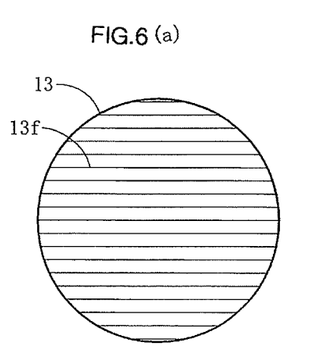
Figure 6C:
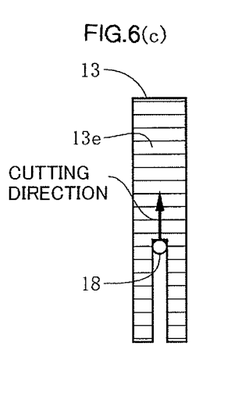

Here, even if the cleavage plane 13e of the ingot 13 is parallel to each wire mark 13f on the surface of the wafer 23, the amount of warp of the wafer 23 obtained by slicing this ingot 13 differs. Its reason will now be described with reference to FIG. 3 to FIG. 6. As shown in FIG. 5(a) and FIG. 6(a), even if the cleavage plane 13e of the ingot 13 is parallel to each wire mark 13f on the surface of the ingot 13, there are two cases, i.e., a case where the cleavage plane 13e of the ingot 13 is inclined with respect to the crystal axis 13b of the ingot 13 as shown in FIG. 5(b) and a case where the same is parallel to the crystal axis 13b of the ingot 13 as shown in FIG. 6(b). Additionally, in the case where the cleavage plane 13e of the ingot 13 is inclined with respect to the crystal axis 13b of the ingot 13 (FIG. 5(b)), when this ingot 13 is sliced, the wire 18 is apt to deviate in a direction indicated by an arrow of a solid line in FIG. 3(a) and an arrow of a broken line in FIG. 5(c), i.e., a direction of the cleavage plane 13e with respect to a cutting direction indicated by an arrow of a broken line in FIG. 3 and an arrow of a solid line in FIG. 5(c). On the other hand, in the case where the cleavage plane 13e of the ingot 13 is parallel to the crystal axis 13b of the ingot 13 (FIG. 6(b)), when this ingot 13 is sliced, the wire 18 is hard to deviate from the cutting direction indicated by an arrow of a broken line in FIG. 4(a) and an arrow of a solid line in FIG. 6(c) and moves straight along the cutting direction. As a result, even if the cleavage plane 13e of the ingot 13 is parallel to each wire mark 13f on the surface of the ingot 13 (FIG. 5(a)), when the cleavage plane 13e of the ingot 13 is inclined with respect to the crystal axis 13b of the ingot 13 as shown in FIG. 5(b), the wafer 23 obtained by slicing the ingot 13 warps as shown in FIG. 3(b). On the other hand, even if the cleavage plane 13e of the ingot 13 is parallel to each wire mark 13f on the surface of the ingot 13 (FIG. 6(a)), when the cleavage plane 13e of the ingot 13 is parallel to the crystal axis 13b of the ingot 13 as shown in FIG. 6(b), the wafer 23 obtained by slicing the ingot 13 does not warp as shown in FIG. 4(b). It is to be noted that, even if the cleavage plane 13e of the ingot 13 is not parallel to the crystal axis 13b of the ingot 13 as shown in FIG. 6(b), the wafer 23 obtained by slicing is hard to warp as long as the cleavage plane 13e of the ingot 13 forms an angle close to the parallel (e.g., approximately 35 to 75 degrees with respect to the crystal axis 13b of the ingot 13).

On the other hand, the predetermined rotation angle around the crystal axis 13b of the ingot 13 may be determined in such a manner that the amount of warp of the wafer 23 obtained by slicing the ingot with the use of the wire saw apparatus 16 becomes minimum. For example, in a case where the crystal axis 13b of the ingot 13 is <111>, when a perpendicular drawn from this crystal axis 13b to the orientation flat 13c is determined as the reference line 13d and the predetermined rotation angle θ (FIG. 3 and FIG. 4) relative to this reference line 13d is set to fall within the range of 35 to 75 degrees, the amount of warp of the wafer 23 after slicing the ingot 13 can be reduced. Further, the predetermined rotation angle around the crystal axis 13b of the ingot 13 may be determined in such a manner that the amount of warp of the wafer 23 sliced by the wire saw apparatus 16 becomes a predetermined amount and the amount of warp of the wafer 23 after forming an epitaxial layer (not shown) on the surface of this wafer 23 becomes minimum. For example, in a case where the crystal axis 13b of the ingot 13 is <111>, when the perpendicular drawn from the crystal axis 13b to the orientation flat 13c is determined as the reference line 13d and the predetermined rotation angle θ (FIG. 3 and FIG. 4) relative to this reference line 13d is determined to fall within the range of 35 to 75 degrees, the amount of warp of the wafer 23 after slicing the ingot 13 and forming an epitaxial layer having a thickness of 0.1 to 200 μm on a surface of the wafer 23 can be reduced.

Figure 8:
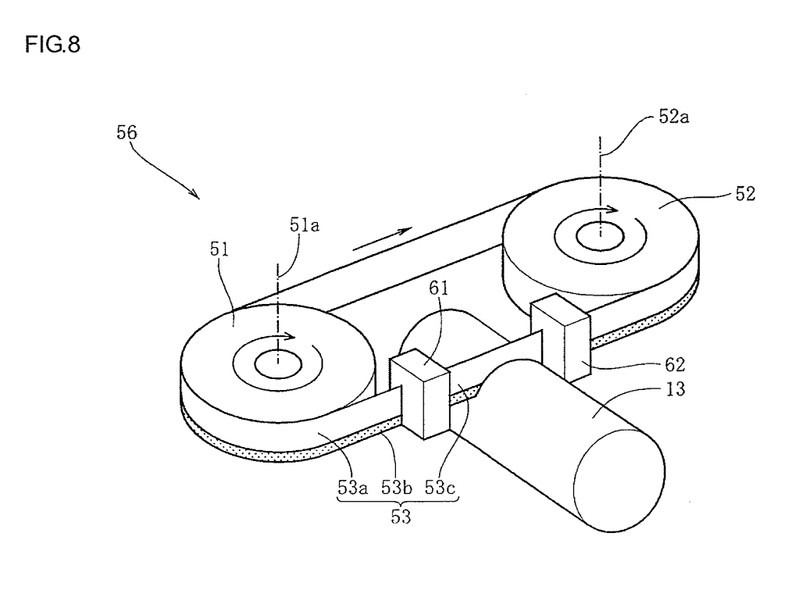
FIG. 8 is a perspective view of a primary part showing a state that an ingot is sliced by a band saw of a band saw apparatus based on a slicing method according to a second embodiment of the present invention.

It is to be noted that the wire saw apparatus is used as the cutting apparatus in the foregoing embodiment, but a band saw apparatus 56 shown in FIG. 8 may be used as the cutting apparatus. This band saw apparatus 56 has first and second pulleys 51 and 52 that have first and second vertical axes 51a and 52b as their rotation centers and are provided at a predetermined interval and a strip-like blade 53 that is wound around the first and second pulleys 51 and 52. This blade 53 is constituted of an endless belt 53a formed of a metal band plate into a ring shape and a cutting blade 53b formed by electrodepositing diamond particles to a lower edge of this belt 53a by an electroplating method, and it is configured to make a circuit between the first and second pulleys 51 and 52 in one direction at a high speed by rotational drive of the first pulley 51. Further, first and second blade fixtures 61 and 62 that suppress oscillation of a portion that linearly moves (a linear moving portion) 53c in the blade 53 in one direction between the first and second pulleys 51 and 52 are arranged at both side portions of this linear moving portion 53c. The first and second blade fixtures 61 and 62 sandwich the blade 53 from both surface sides by using carbon shoes (not shown) and hold the blade 53 in a posture parallel to the cutting direction in contact. Furthermore, the silicon single crystal ingot 13 is arranged below the linear moving portion 53c of the blade 53 so as to be orthogonal to the blade 53, the first and second pulleys 51 and 52 are moved down in the vertical direction while allowing the blade 53 to make a circuit in one direction, and the ingot 13 is cut by the cutting blade 53b of the linear moving portion 53c of the blade 53. It is to be noted that a holder that bonds and holds the ingot 13 is not shown in FIG. 8.

Moreover, in the foregoing embodiments, although the silicon single crystal ingot is used as the semiconductor single crystal ingot, it is also possible to adopt, e.g., a silicon carbide (SiC) single crystal ingot, a gallium arsenic (GaAs) single crystal ingot, or a sapphire single crystal ingot. Additionally, in the first and second embodiments, although each of the wire saw apparatus and the band saw apparatus is used as the cutting apparatus, an ID saw (an inner diameter saw) may be used. Further, in the foregoing embodiments, although the perpendicular drawn from the crystal axis of the ingot to the orientation flat is used as the reference line and the predetermined rotation angle around the crystal axis of the ingot is determined, a perpendicular drawn from the crystal axis of the ingot to a notch may be used as a reference line, and a predetermined rotation angle around the crystal axis of the ingot may be determined. Furthermore, if a rotation reference portion that substitutes for the orientation flat or the notch is present, a perpendicular drawn from the crystal axis of the ingot to this rotation reference portion may be used as a reference line, and a predetermined rotation angle around the crystal axis of the ingot may be determined.

EXAMPLES

Examples and comparative examples of the present invention will now be described in detail.

Example 1

As shown in FIG. 1 and FIG. 2, a cylindrical silicon single crystal ingot 13 having a diameter of 150 mm and a crystal axis of <111>was prepared. This ingot 13 was bonded to and held by a holder 14 in a state that the ingot 13 was rotated at a predetermined rotation angle around a crystal axis 13b of the ingot 13 different from a center axis 13a of the cylinder thereof. At this time, the crystal axis 13b of the ingot 13 was detected based on an angle of an X-ray emitted and reflected on a crystal plane. Further, the predetermined rotation angle at the time of bonding the ingot 13 to the holder 14 was also determined. Furthermore, when a perpendicular drawn from the crystal axis 13b of the ingot 13 to an orientation flat 13c is a reference line 13d, the predetermined rotation angle was determined to be a rotation angle θ (FIG. 3 and FIG. 4) relative to the reference line 13d. Specifically, the ingot 13 was moved in such a manner that the crystal axis 13b of the ingot 13 becomes substantially parallel to respective center axes of the first and second main rollers 11 and 12 above a wire 18 horizontally stretched between first and second main rollers 11 and 12 of the wire saw apparatus 16 and between vertical lines running through the respective center axes of the first and second main rollers 11 and 12 (FIG. 1 and FIG. 2). At this time, a vertical plane including the crystal axis 13b of the ingot 13 was arranged to be orthogonal to an extending direction of the wire 18 between the first and second main rollers 11 and 12 (FIG. 7(c)). Moreover, the ingot 13 was sliced by moving down this ingot 13 in the vertical direction and moving it to a position cutting across the wire 18 that moves in the horizontal direction, thereby fabricating a wafer 23. The predetermined rotation angle θ was adjusted to fall within a predetermined range, the ingot 13 was likewise sliced, and a wafer 23 was fabricated. These wafers 23 were determined as Example 1.

Comparative Example 1

An ingot was sliced like Example 1 and each wafer was fabricated except that the ingot was bonded to and held by a holder in a state that the ingot was rotated at an arbitrary rotation angle around a crystal axis of the ingot different from a center axis of the cylinder of the ingot. Each wafer was determined as Comparative Example 1.

<Test 1 and Evaluation>

Figure 9:
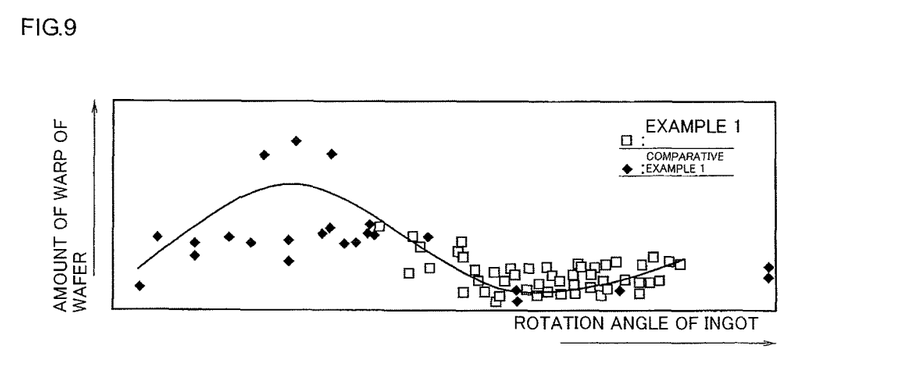
FIG. 9 is a view showing changes in an amount of warp of a wafer when a rotation angle of an ingot according to each of Example 1 and Comparative Example 1 is changed.

An amount of warp of each wafer according to Example 1 and Comparative Example 1 was measured. As to this amount of warp of each wafer, on a back side of each wafer, a plane running through three points that are provided at positions on the inner side which are 3 mm away from an outer peripheral edge of the wafer and taken at intervals of 120 degrees with the crystal axis of the wafer at the center was assumed, and a maximum value in magnitudes of warp of the wafer measured from this plane was used. FIG. 9 shows a result.

As obvious from FIG. 9, although amounts of warp of the wafers were small in the range of the predetermined rotation angle but the amounts of warp of the wafers were large outside the range of the predetermined rotation angle in Comparative Example 1, whereas all amounts of warp of the wafers were small in Example 1.

Example 2

Three ingots in different lots, which are the same ingots as that in Example 1, were sliced, and respective wafers were fabricated. However, each wafer was fabricated like Example 1 except that a predetermined rotation angle at which each ingot is rotated around a crystal axis thereof at the time of bonding the ingot to a holder was set to each of 51 degrees, 55 degrees, and 56 degrees. Each of these wafers was determined as Example 2.

<Test 2 and Evaluation>

Figure 10:
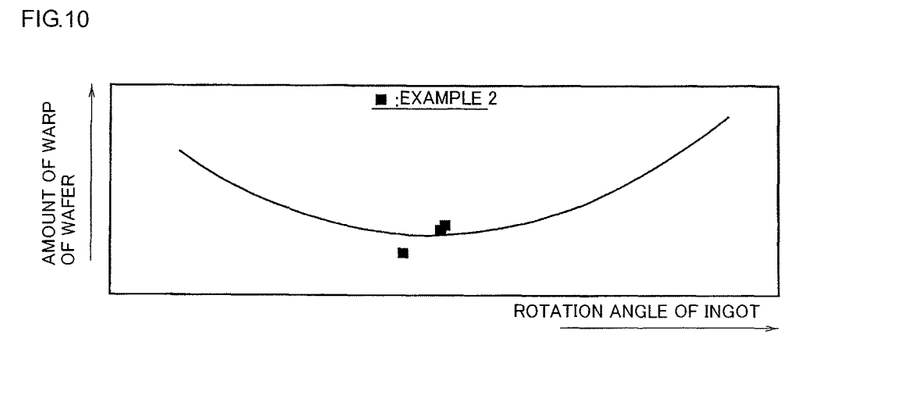
FIG. 10 is a view showing changes in an amount of warp of a wafer when a rotation angle of an ingot according to Example 2 is changed.

An amount of warp of each wafer according to Example 2 was measured like Test 1. Moreover, an approximation curve representing a change in an amount of warp of each wafer relative to a change in a rotation angle of the ingot was obtained from measurement values of the wafers according to Example 1 and Comparative Example 1 measured in Test 1. FIG. 10 shows a relationship between amounts of warp of the wafers according to Example 2 and the approximation curve.

As obvious from FIG. 10, it was understood that the amounts of warp of the wafers according to Example 2 substantially coincide with the approximation curve. As a result, it was confirmed that setting the predetermined rotation angle for rotation around the ingot at the time of bonding the ingot to the holder to fall within a predetermined range enables accurately controlling the amount of warp of each wafer.

Example 3

An ingot having a diameter of 150 mm and a crystal axis of <111>was sliced to fabricate 200 wafers. However, each wafer was fabricated like Example 1 except that a predetermined rotation angle at which the ingot is rotated around a crystal axis thereof at the time of bonding the ingot to a holder was set to 50 degrees in order to set an amount of warp of each wafer obtained by slicing to a target (objective) amount of warp. These wafers were determined as Example 3.

Comparative Example 2

An ingot having the same shape as the ingot according to Example 3 was sliced to fabricate 200 wafers. However, each wafer was fabricated like Example 1 except that a rotation angle at which the ingot is rotated around a crystal axis thereof at the time of bonding the ingot to a holder was set to 25 degrees. These wafers were determined as Comparative Example 2.

Comparative Example 3

An ingot having the same shape as the ingot according to Example 3 was sliced to fabricate 200 wafers. However, each wafer was fabricated like Example 1 except that a rotation angle at which the ingot is rotated around a crystal axis thereof at the time of bonding the ingot to a holder was set to 25 degrees and the ingot was cut at a speed that is ½ of that in Comparative Example 2. These wafers were determined as Comparative Example 3.

<Test 3 and Evaluation>

Figure 11:
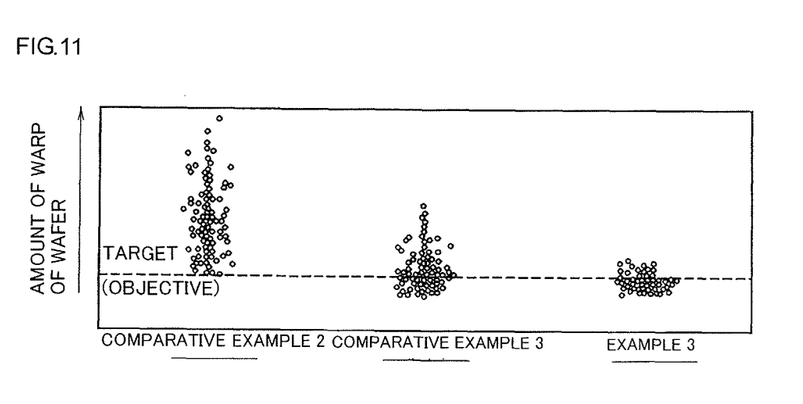
FIG. 11 is a view showing a distribution of an actual amount of warp relative to a target (objective) amount of warp of a wafer according to each of Example 3, Comparative Example 2, and Comparative Example 3.

An amount of warp of each wafer according to Example 3 and Comparative Examples 2 and 3 was measured like Test 1. FIG. 11 shows a result.

As obvious from FIG. 11, variations greatly occurred in a direction along which the amount of warp increases with respect to the target (objective) amount of warp in the wafers according to Comparative Example 2, variations occurred around the target (objective) amount of warp and they relatively greatly occurred in the wafers according to Comparative Example 3, but variations occurred around the target (objective) amount of warp and these variations were small even though a cutting speed was equal to that in Comparative Example 2 in the wafers according to Example 3.

Example 4

An ingot having a diameter of 125 mm and a crystal axis of <111> was sliced to fabricate 43 wafers. However, each wafer was fabricated like Example 1 except that a predetermined rotation angle at which the ingot is rotated around a crystal axis thereof at the time of bonding the ingot to a holder was set to 50 degrees so that an amount of warp of each wafer immediately after slicing can become a target (objective) amount of warp in order to reduce an amount of warp of each wafer when an epitaxial layer was formed on a surface of the wafer obtained by slicing. These wafers were determined as Example 4.

Comparative Example 4

An ingot having the same shape as the ingot according to Example 4 was sliced to fabricate 51 wafers. However, each wafer was fabricated like Example 1 except that a rotation angle at which the ingot is rotated around a crystal axis thereof at the time of bonding the ingot to a holder was set to 25 degrees without considering a reduction in an amount of warp of each wafer when an epitaxial layer was formed on a surface of the wafer obtained by slicing. These wafers were determined as Comparative Example 4.

<Test 4 and Evaluation>

Figure 12:
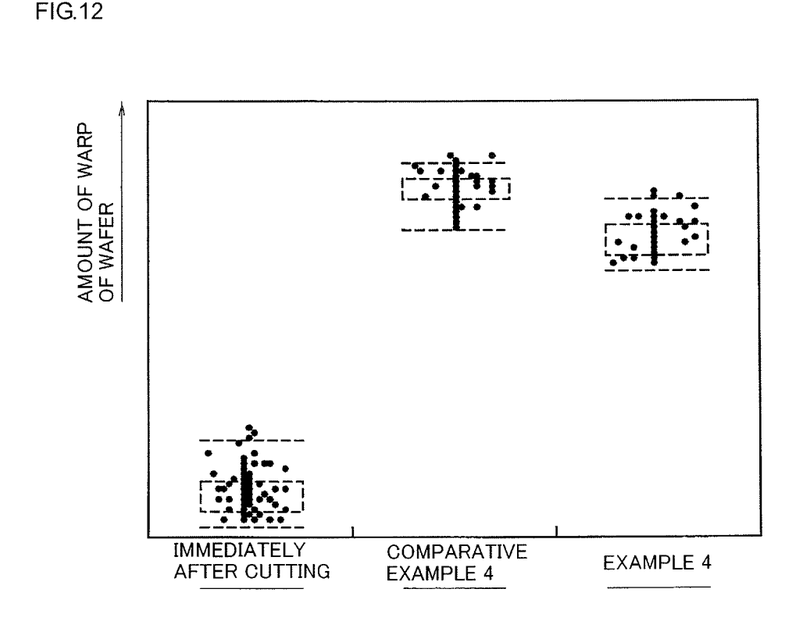
FIG. 12 is a view showing a distribution of an amount of warp of each of a wafer having no epitaxial layer formed thereon immediately after cutting, a wafer having an epitaxial layer formed thereon according to Example 4, and a wafer having an epitaxial layer formed thereon according to Comparative Example 4.

An amount of warp of each wafer after forming an epitaxial layer on a surface of the wafer according to each of Example 4 and Comparative Example 4 was measured like Test 1. FIG. 12 shows a result. It is to be noted that, in FIG. 12, data immediately after cutting is an amount of warp of each wafer immediately after cutting the ingot before forming an epitaxial layer on a surface of the wafer which is each wafer according to Comparative Example 4.

As obvious from FIG. 12, each wafer after forming the epitaxial layer in Comparative Example 4 has a relatively large amount of warp, whereas each wafer after forming the epitaxial layer in Example 4 has a relatively small amount of warp.

What is claimed is:

1. A method for slicing a semiconductor single crystal ingot, comprising:
    bonding a cylindrical semiconductor single crystal ingot to a holder so that that the ingot is positioned and held at a predetermined rotation angle around a crystal axis of the ingot, the crystal axis being different from a center axis of the cylinder of the ingot, and
    slicing the ingot that is positioned and held at the predetermined rotation angle with a cutting apparatus,
    wherein:
    an orientation flat or a notch of the ingot is determined as a rotation reference portion, a perpendicular drawn from the crystal axis of the ingot to the rotation reference portion is determined as a reference line, a rotation angle from a vertical line to the reference line is determined as the predetermined rotation angle, and the predetermined rotation angle is determined in such a manner that an amount of warp of a wafer sliced out by the cutting apparatus becomes a predetermined amount.

2. The method for slicing a semiconductor single crystal ingot according to claim 1, wherein a correlation of a change in the amount of warp of the wafer relative to a change in the predetermined rotation angle is obtained by an experiment in advance, and the predetermined rotation angle is determined from the correlation.

3. The method for slicing a semiconductor single crystal ingot according to claim 1, wherein the predetermined rotation angle at the time of bonding and holding the ingot with the use of the holder is determined in such a manner that an amount of warp of a wafer sliced out by the cutting apparatus becomes minimum.

4. The method for slicing a semiconductor single crystal ingot according to claim 1, wherein the predetermined rotation angle at the time of bonding and holding the ingot with the use of the holder is determined in such a manner that an amount of warp of a wafer sliced out by the cutting apparatus becomes a predetermined amount and an amount of warp of the wafer after forming an epitaxial layer on a surface of the wafer becomes minimum.

5. The method for slicing a semiconductor single crystal ingot according to claim 1, wherein the predetermined rotation angle falls within a range of 35 to 75 degrees, 105 to 145 degrees, 215 to 255 degrees, or 285 to 325 degrees.

* * * * *